United States Patent
Park et al.

(10) Patent No.: US 7,362,158 B2
(45) Date of Patent: Apr. 22, 2008

(54) LEVEL SHIFTER AND A DISPLAY DEVICE HAVING THE SAME

(75) Inventors: Tae-Hyeong Park, Yongin-si (KR); Kook-Chul Moon, Yongin-si (KR); Il-Gon Kim, Seoul (KR); Chul-Ho Kim, Seoul (KR); Kyung-Hoon Kim, Uiwang-si (KR); Ho-Suk Maeng, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 50 days.

(21) Appl. No.: 11/429,297

(22) Filed: May 5, 2006

(65) Prior Publication Data
US 2007/0035339 A1 Feb. 15, 2007

(30) Foreign Application Priority Data
Aug. 10, 2005 (KR) .................. 10-2005-0073094

(51) Int. Cl.
*H03L 5/00* (2006.01)
(52) U.S. Cl. .................. 327/333; 326/63; 326/80
(58) Field of Classification Search ............ None
See application file for complete search history.

(56) References Cited

U.S. PATENT DOCUMENTS

| | | | | |
|---|---|---|---|---|
| 5,136,190 A * | 8/1992 | Chern et al. | .................. | 326/81 |
| 5,317,213 A * | 5/1994 | Sato et al. | .................. | 326/63 |
| 5,525,926 A * | 6/1996 | Merritt | .................. | 327/535 |
| 5,696,721 A * | 12/1997 | McAdams et al. | ...... | 365/189.11 |
| 6,472,905 B1 * | 10/2002 | Manning | .................. | 326/80 |
| 6,713,324 B2 * | 3/2004 | Shiba et al. | ................. | 438/149 |
| 7,038,492 B2 * | 5/2006 | Wu et al. | ..................... | 326/81 |

* cited by examiner

*Primary Examiner*—N. Drew Richards
*Assistant Examiner*—An T. Luu
(74) *Attorney, Agent, or Firm*—F. Chau & Associates, LLC

(57) ABSTRACT

A level shifter and a display device having the same are provided. In a level shifter, a first transistor includes a gate electrode receiving a first driving voltage, and a source electrode receiving an input signal through an input terminal. A second transistor includes a drain electrode receiving the first driving voltage, and a source electrode electrically connected to a drain electrode of the first transistor through a first node. A third transistor includes a source electrode receiving a second driving voltage, a drain electrode electrically connected to a gate electrode of the second transistor through a second node, and a gate electrode receiving the input signal. A fourth transistor includes a drain electrode receiving the first driving voltage, a gate electrode electrically connected to the drain electrode of the first transistor through the first node, and a source electrode electrically connected to the drain electrode of the third transistor through the second node. An inverter inverts a signal outputted from the second node to apply the inverted signal to an output terminal.

20 Claims, 7 Drawing Sheets

LEVEL SHIFTER AND A DISPLAY DEVICE HAVING THE SAME

CROSS-REFERENCE TO RELATED APPLICATION

The present application claims priority to Korean Patent Application No. 2005-73094, filed on Aug. 10, 2005, the disclosure of which is incorporated by reference herein in its entirety.

BACKGROUND OF THE INVENTION

1. Technical Field

The present invention relates to a level shifter and a display device having the level shifter, and more particularly, to a level shifter having a single input terminal and a display device having the level shifter.

2. Discussion of the Related Art

A liquid crystal display (LCD) has become one of the most widely used flat panel displays since its small size, thinness, and low power consumption make it suitable for use in many electronic devices. For example, the LCD is commonly found in a variety of electronic devices such as flat screen televisions, laptop computers, cell phones, and digital cameras.

There are two main types of LCDs currently used in electronic devices; they are passive matrix and active matrix. Since an active matrix type LCD uses thin film transistors as switching elements for displaying a moving image, they are much brighter and sharper than passive matrix displays of the same size and generally have quicker response times. Thus, active matrix displays are increasingly becoming the choice of laptop computer and flat screen television manufacturers.

The active matrix type LCD typically includes a plurality of gate lines, a plurality of data lines and a plurality of pixels that are defined by the gate and data lines to display an image. Each of the pixels includes a liquid crystal cell that varies a light transmittance in response to a voltage level of a data signal that is applied to the pixels through the data lines. Each of the thin film transistors is located on a portion of one of the pixels where one of the gate lines crosses one of the data lines. The thin film transistors are used to control an input of the data signal that is applied to the liquid crystal cells based on a scan signal that is applied to the pixels through the gate lines.

The active matrix type LCD also includes a level shifter that is used to elevate a level of one of a plurality of externally provided signals input from an integrated circuit to drive an LCD panel. For example, the level shifter may increase the level of one of the signals from about 3.3V to about 5V. A conventional level shifter typically includes dual input terminals for receiving such externally provided signals; however, when the level shifter includes the dual input terminals, the number of input pads and a size of the level shifter increases, thus increasing the power consumed by the LCD panel.

SUMMARY OF THE INVENTION

A level shifter in accordance with one aspect of the present invention includes a first transistor, a second transistor, a third transistor, a fourth transistor and an inverter. The first transistor includes a gate electrode receiving a first driving voltage, and a source electrode receiving an input signal through an input terminal. The second transistor includes a drain electrode receiving the first driving voltage, and a source electrode electrically connected to a drain electrode of the first transistor through a first node. The third transistor includes a source electrode receiving a second driving voltage, a drain electrode electrically connected to a gate electrode of the second transistor through a second node, and a gate electrode receiving the input signal. The fourth transistor includes a drain electrode receiving the first driving voltage, a gate electrode electrically connected to the drain electrode of the first transistor through the first node, and a source electrode electrically connected to the drain electrode of the third transistor through the second node. The inverter inverts a signal outputted from the second node to apply the inverted signal to an output terminal.

A level shifter in accordance with another aspect of the present invention includes a first driving voltage terminal, a second driving voltage terminal, an input terminal, a first transistor, a second transistor, a third transistor, a fourth transistor, an inverter and an output terminal. The first driving voltage terminal receives a first driving voltage. The second driving voltage terminal receives a second driving voltage. The input terminal receives an input signal. The first transistor includes a gate electrode electrically connected to the first driving voltage terminal, and a source electrode electrically connected to the input terminal. The second transistor includes a drain electrode receiving the first driving voltage, and a source electrode electrically connected to a drain electrode of the first transistor through a first node. The third transistor includes a source electrode electrically connected to the second driving voltage terminal, a drain electrode electrically connected to a gate electrode of the second transistor through a second node, and a gate electrode receiving the input signal. The fourth transistor includes a drain electrode electrically connected to the first driving voltage terminal, a gate electrode electrically connected to the drain electrode of the first transistor through the first node, and a source electrode electrically connected to the drain electrode of the third transistor through the second node. The inverter inverts a signal outputted from the second node. The inverted signal is outputted through the output terminal.

A display device in accordance with yet another aspect of the present invention includes a display panel having a pixel part in a pixel region defined by data and gate lines adjacent to each other, a gate driving part applying a gate voltage to the gate line, and a data driving part applying a data voltage to the data line. At least one of the gate and data driving parts includes a level shifter having a single input terminal and a single output terminal. The level shifter receives a first signal having a first level through the input terminal, and the level shifter outputs a second signal having a second level through the output terminal. The level shifter includes a first transistor, a second transistor, a third transistor, a fourth transistor and an inverter. The first transistor includes a gate electrode receiving a first driving voltage, and a source electrode receiving the fist signal through the input terminal. The second transistor includes a drain electrode receiving the first driving voltage, and a source electrode electrically connected to the drain electrode of the first transistor through a first node. The third transistor includes a source electrode receiving a second driving voltage, a drain electrode electrically connected to the gate electrode of the second transistor through a second node, and a gate electrode receiving the first signal. The fourth transistor includes a drain electrode receiving the first driving voltage, a gate electrode electrically connected to the drain electrode of the first transistor through the first node, and a source electrode electrically connected to the drain electrode of the third transistor through the second node. The inverter inverts a signal outputted from the second node to apply the inverted signal to the output terminal, wherein the inverted signal is the second signal.

BRIEF DESCRIPTION OF THE DRAWINGS

The above and other features of the present invention will become more apparent by describing in detail exemplary embodiments thereof with reference to the accompanying drawings, in which.

DESCRIPTION OF EXEMPLARY EMBODIMENTS

Figure 1:
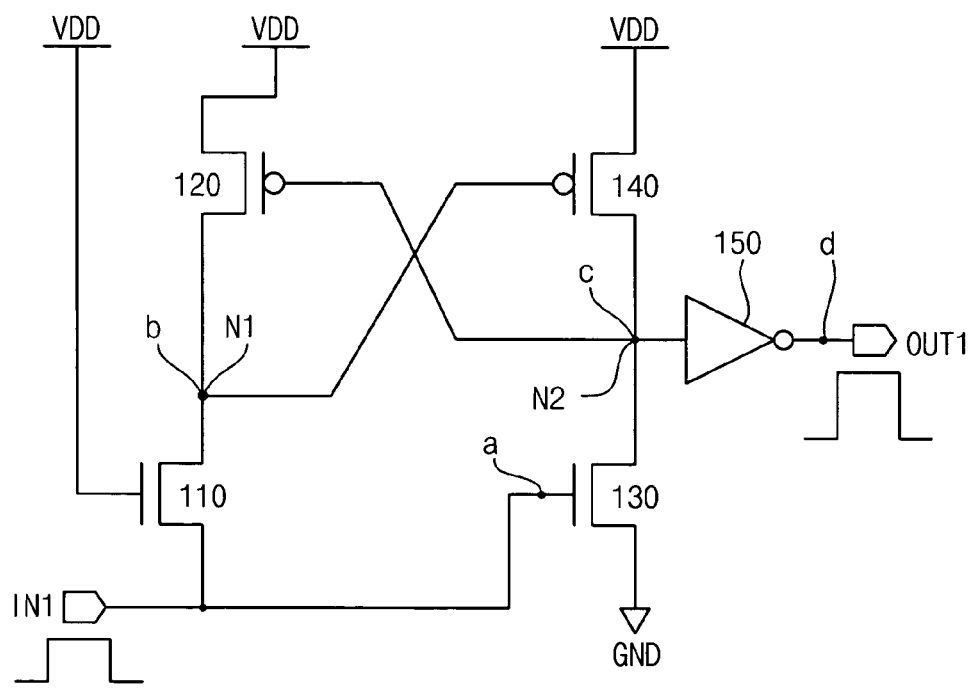
FIG. 1 is a circuit diagram showing a level shifter in accordance with an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
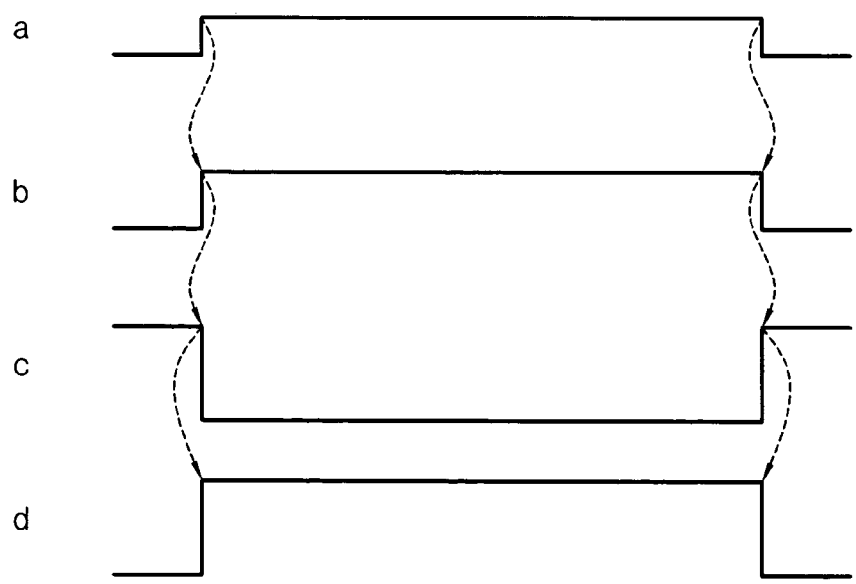
FIG. 2 is a timing diagram showing input/output characteristics of the level shifter shown in FIG. 1.

FIG. 1 is a circuit diagram showing a level shifter 100 in accordance with an exemplary embodiment of the present invention. FIG. 2 is a timing diagram showing input/output characteristics of the level shifter 100 shown in FIG. 1.

Referring to FIGS. 1 and 2, the level shifter 100 includes a first transistor 110, a second transistor 120, a third transistor 130, a fourth transistor 140 and an inverter 150. In FIGS. 1 and 2, a voltage applied to a drain electrode of each of the first, second, third, and fourth transistors 110, 120, 130, and 140 has a greater level than a voltage applied to a source electrode of each of the first, second, third, and fourth transistors 110, 120, 130, and 140. Alternatively, the voltage applied to the drain electrode of each of the first, second, third, and fourth transistors 110, 120, 130, and 140 may have a smaller level than the voltage applied to the source electrode of each of the first, second, third, and fourth transistors 110, 120, 130, and 140.

A first driving voltage VDD is applied to a gate electrode of the first transistor 110. An externally provided input signal is applied to a source electrode of the first transistor 110 through an input terminal IN1. For example, the first transistor 110 may be an N-channel metal oxide semiconductor (NMOS) transistor. A ratio of a channel width to a channel length of the first transistor 110 is about 10/6.

The first driving voltage VDD is applied to a drain electrode of the second transistor 120. A source electrode of the second transistor 120 is electrically connected to the drain electrode of the first transistor 110. For example, the second transistor 120 may be a P-channel metal oxide semiconductor (PMOS) transistor. A ratio of a channel width to a channel length of the second transistor 120 is about 5/10.

A second driving voltage GND is applied to a source electrode of the third transistor 130. A drain electrode of the third transistor 130 is electrically connected to a gate electrode of the second transistor 120 through a second node N2. The externally provided input signal is applied to a gate electrode of the third transistor 130. For example, the third transistor 130 may be an N-channel metal oxide semiconductor (NMOS) transistor. A ratio of a channel width to a channel length of the third transistor 130 is about 50/6.

The first driving voltage VDD is applied to a drain electrode of the fourth transistor 140. A gate electrode of the fourth transistor 140 is electrically connected to the drain electrode of the first transistor 110 through a first node N1. A source electrode of the fourth transistor 140 is electrically connected to the drain electrode of the third transistor 130 through the second node N2. For example, the fourth transistor 140 may be a P-channel metal oxide semiconductor (PMOS) transistor. A ratio of a channel width to a channel length of the fourth transistor 140 is about 10/6.

The inverter 150 inverts a signal outputted from the second node N2, and applies the inverted signal to an output terminal OUT1. The inverter 150 includes a complementary metal oxide semiconductor (CMOS) transistor that includes a PMOS part and an NMOS part. A ratio of a channel width to a channel length of the PMOS part of the CMOS transistor is about 10/6, and a ratio of a channel width to a channel length of the NMOS part of the CMOS transistor is about 10/7.

Hereinafter, an operation of the level shifter 100 will be described.

When an input signal that rises from a low level to a high level is applied to the input terminal IN1, the third transistor 130 is turned on so that a level of the second node N2 is changed from a high level to a low level. For example, the low level may be a ground potential, and the high level may be about 3V.

When the level of the second node N2 is changed from the high level to the low level, the second transistor 120 is turned on so that a level of the first node N1 is changed from a low level to a high level. Here, the first transistor 110 may function as a resistor.

When the level of the first node N1 is changed from the low level to the high level, the fourth transistor 140 is turned off so that the level of the second node N2 can be rapidly decreased. The voltage of the second node N2 is inverted by the inverter 150, and the inverted voltage is applied to the output terminal OUT1. For example, when the first driving voltage VDD is about 5V, the inverted voltage applied to the output terminal OUT1 is about 5V. In addition, when the first driving voltage VDD is about 8.5V, the inverted voltage applied to the output terminal OUT1 is about 8.5V.

When an input signal that falls from the high level to the low level is applied to the input terminal IN1, the third transistor 130 is turned off so that the level of the second node N2 is changed from the low level to the high level.

When the level of the second node N2 is changed from the low level to the high level, the second transistor 120 is turned off so that the level of the first node N1 is changed from the high level to the low level. Again, the first transistor 110 may function as a resistor.

When the level of the first node N1 is changed from the high level to the low level, the fourth transistor 140 is turned on so that the level of the second node N2 can be rapidly increased. The voltage of the second node N2 is inverted by the inverter 150, and the inverted voltage is applied to the output terminal OUT1.

Figure 3:
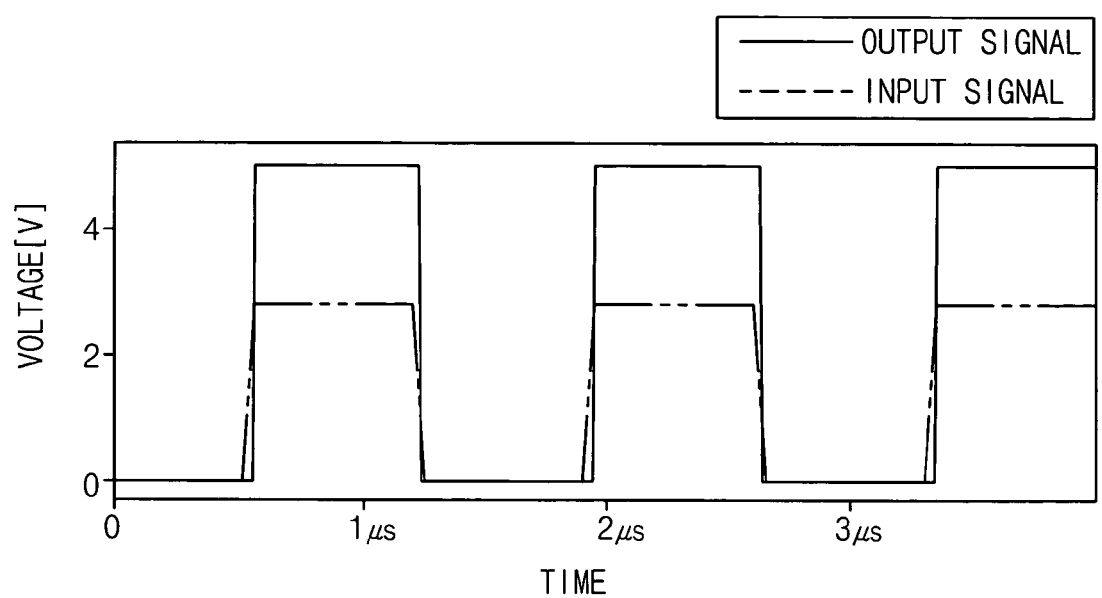
FIG. 3 is a timing diagram showing voltage characteristics of the level shifter shown in FIG. 1.
Figure 4:
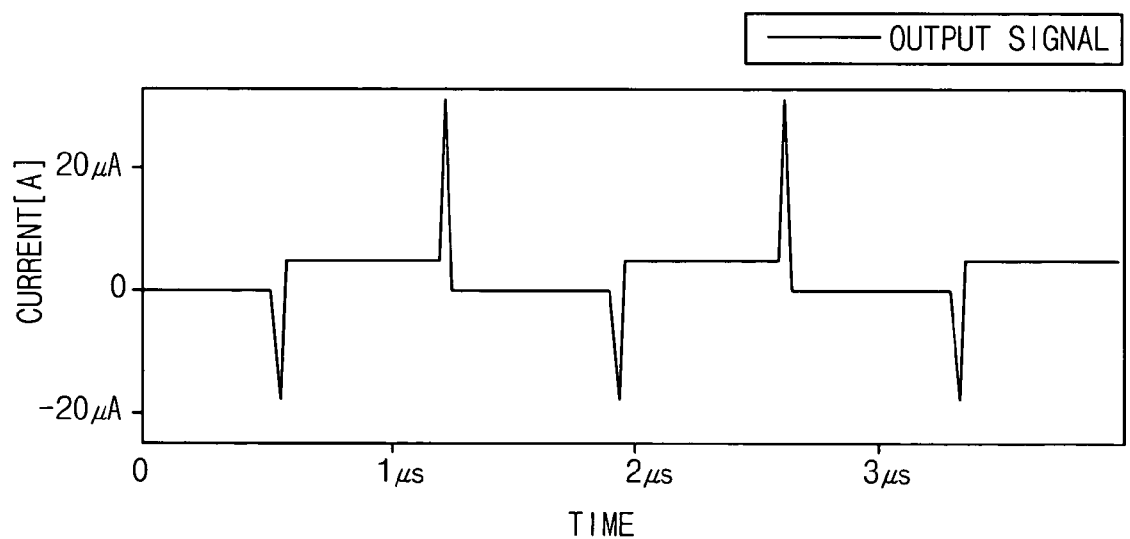
FIG. 4 is a timing diagram showing current characteristics of the level shifter shown in FIG. 1.

FIG. 3 is a timing diagram showing voltage characteristics of the level shifter 100 shown in FIG. 1. FIG. 4 is a timing diagram showing current characteristics of the level shifter 100 shown in FIG. 1.

As shown in FIG. 3, for example, an input signal inputted to the input terminal IN1 having a level of about 3V and a period of about 1.4 µs is changed into an output signal outputted from the output terminal OUT1 having a level of about 5V and a period of about 1.4 µs.

Referring to FIG. 3, the output signal is not delayed with respect to the input signal, thus improving the output signal.

Referring to FIG. 4, the level shifter 100 generates the improved output signal, and power consumption during an off state of the level shifter 100 is substantially zero. In particular, when the level of the output signal is increased from about 3V to about 5V, a leakage current during a rising period is about 5 µA, and a peak current formed during a falling period is decreased.

In FIGS. 1 to 4, when the second transistor 120 is a PMOS transistor and the fourth transistor 140 is a PMOS transistor, they may be electrically connected so that a current flows through the second and fourth transistors 120 and 140 only during an operating period of the level shifter 100.

In addition, when the first driving voltage VDD is applied to the gate electrode of the first transistor 110 when the first transistor 110 is an NMOS transistor, the operation of the level shifter 100 may not be changed due to a variation of a threshold voltage of the NMOS transistor.

Figure 5:
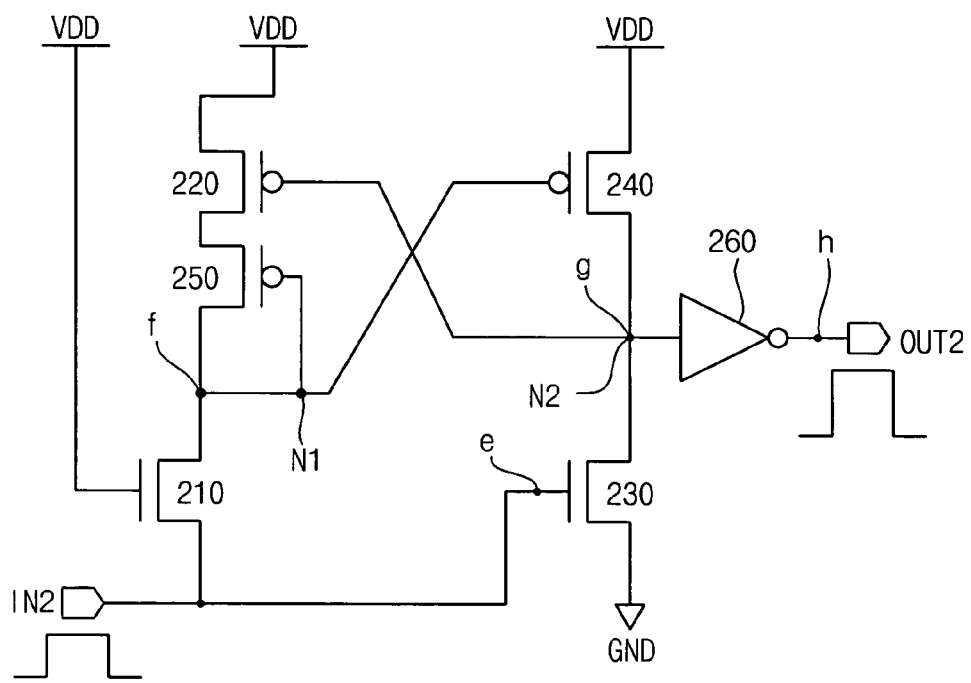
FIG. 5 is a circuit diagram showing a level shifter in accordance with another exemplary embodiment of the present invention.
Figure 6:
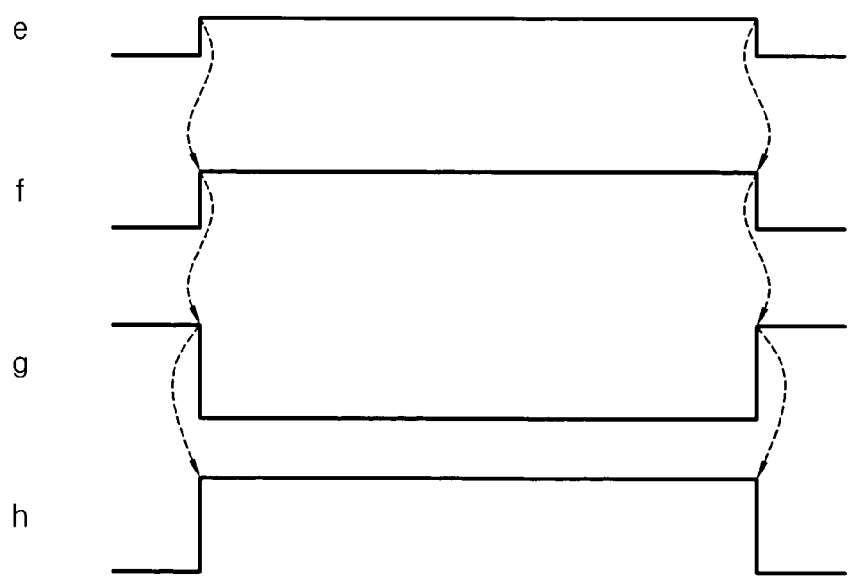
FIG. 6 is a timing diagram showing input/output characteristics of the level shifter shown in FIG. 5.

FIG. 5 is a circuit diagram showing a level shifter 200 in accordance with another exemplary embodiment of the present invention. FIG. 6 is a timing diagram showing input/output characteristics of the level shifter 200 shown in FIG. 5.

Referring to FIGS. 5 and 6, the level shifter 200 includes a first transistor 210, a second transistor 220, a third transistor 230, a fourth transistor 240, a fifth transistor 250 and an inverter 260.

A first driving voltage VDD is applied to a gate electrode of the first transistor 210. An externally provided input signal is applied to a source electrode of the first transistor 210 through an input terminal IN2. For example, the first transistor 210 may be an N-channel metal oxide semiconductor (NMOS) transistor. A ratio of a channel width to a channel length of the first transistor 210 is about 10/6.

The first driving voltage VDD is applied to a drain electrode of the second transistor 220. A source electrode of the second transistor 220 is electrically connected to a drain electrode of the fifth transistor 250. For example, the second transistor 220 may be a P-channel metal oxide semiconductor (PMOS) transistor. A ratio of a channel width to a channel length of the second transistor 220 is about 5/10.

A second driving voltage GND is applied to a source electrode of the third transistor 230. A drain electrode of the third transistor 230 is electrically connected to a gate electrode of the second transistor 220 through a second node N2. The externally provided input signal is applied to a gate electrode of the third transistor 230. For example, the third transistor 230 may be an N-channel metal oxide semiconductor (NMOS) transistor. A ratio of a channel width to a channel length of the third transistor 230 is about 50/6.

The first driving voltage VDD is applied to a drain electrode of the fourth transistor 240. A gate electrode of the fourth transistor 240 is electrically connected to the drain and gate electrodes of the fifth transistor 250 through a first node N1. A source electrode of the fourth transistor 240 is electrically connected to the drain electrode of the third transistor 230 through the second node N2. For example, the fourth transistor 240 may be a P-channel metal oxide semiconductor (PMOS) transistor. A ratio of a channel width to a channel length of the fourth transistor 240 is about 10/6.

The drain electrode of the fifth transistor 250 is electrically connected to the source electrode of the second transistor 220. The gate electrode of the fifth transistor 250 is electrically connected to the source electrode of the fifth transistor 250 through the first node N1. For example, the fifth transistor 250 may be a P-channel metal oxide semiconductor (PMOS) transistor. A ratio of a channel width to a channel length of the fifth transistor 250 is about 5/5.

The fifth transistor 250 functions as a resistor so that only a small amount of a current flows through the level shifter 200 in a starting period and an ending period of an operating period thereof, thereby decreasing a leakage current during the operating period. Therefore, when the level shifter 200 includes the fifth transistor 250, an output signal of the level shifter 200 is improved.

The inverter 260 inverts a signal outputted from the second node N2, and applies the inverted signal to an output terminal OUT2. The inverter 260 includes a complementary metal oxide semiconductor (CMOS) transistor that includes a PMOS portion and an NMOS portion. A ratio of a channel width to a channel length of the PMOS portion of the CMOS transistor is about 10/6, and a ratio of a channel width to a channel length of the NMOS portion of the CMOS transistor is about 10/7.

Hereinafter, an operation of the level shifter 200 will be described.

When an input signal that rises from a low level to a high level is applied to the input terminal IN2, the third transistor 230 is turned on so that a level of the second node N2 is changed from a high level to a low level. For example, the low level may be a ground potential, and the high level may be about 3V.

When the level of the second node N2 is changed from the high level to the low level, the second transistor 220 is turned on so that a level of the first node N1 is changed from a low level to a high level. Here, the first transistor 210 may function as a resistor, and the fifth transistor 250 may function as a diode.

When the level of the first node N1 is changed from the low level to the high level, the fourth transistor 240 is turned off so that the level of the second node N2 can be rapidly decreased. The voltage of the second node N2 is inverted by the inverter 260, and the inverted voltage is applied to the output terminal OUT2. For example, when the first driving voltage VDD is about 5V, the inverted voltage applied to the output terminal OUT2 is about 5V. In addition, when the first driving voltage VDD is about 8.5V, the inverted voltage applied to the output terminal OUT2 is about 8.5V.

When an input signal that falls from the high level to the low level is applied to the input terminal IN2, the third transistor 230 is turned off so that the level of the second node N2 is changed from the low level to the high level.

When the level of the second node N2 is changed from the low level to the high level, the second transistor 220 is turned off so that the level of the first node N1 is changed from the high level to the low level. Again, the first transistor 210 may function as a resistor.

When the level of the first node N1 is changed from the high level to the low level, the fourth transistor 240 is turned on so that the level of the second node N2 can be rapidly increased. The voltage of the second node N2 is inverted by the inverter 260, and the inverted voltage is applied to the output terminal OUT2.

Figure 7:
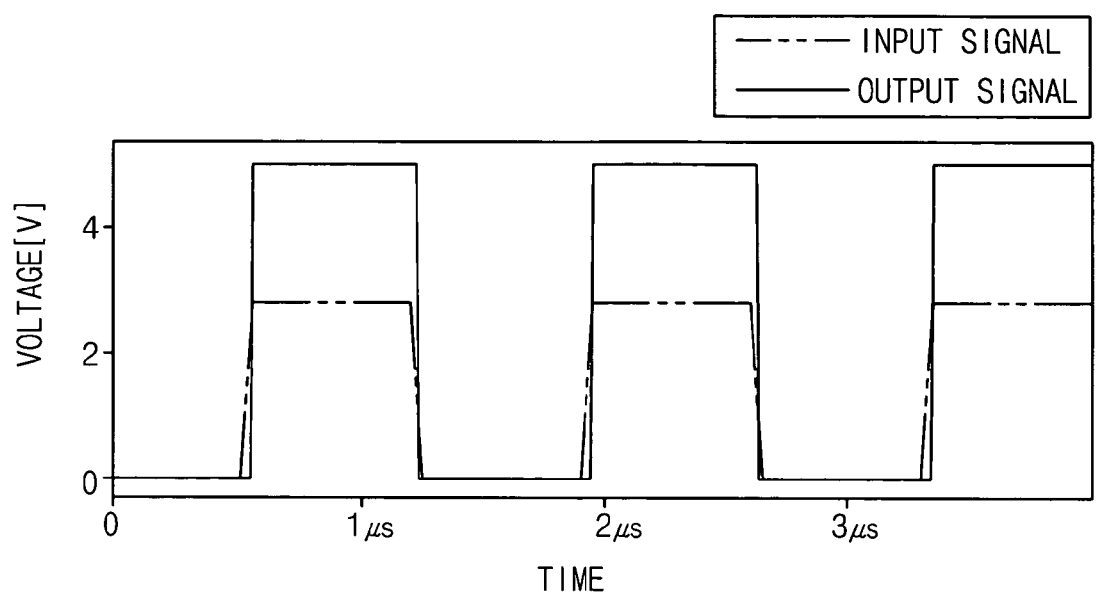
FIG. 7 is a timing diagram showing voltage characteristics of the level shifter shown in FIG. 5.
Figure 8:
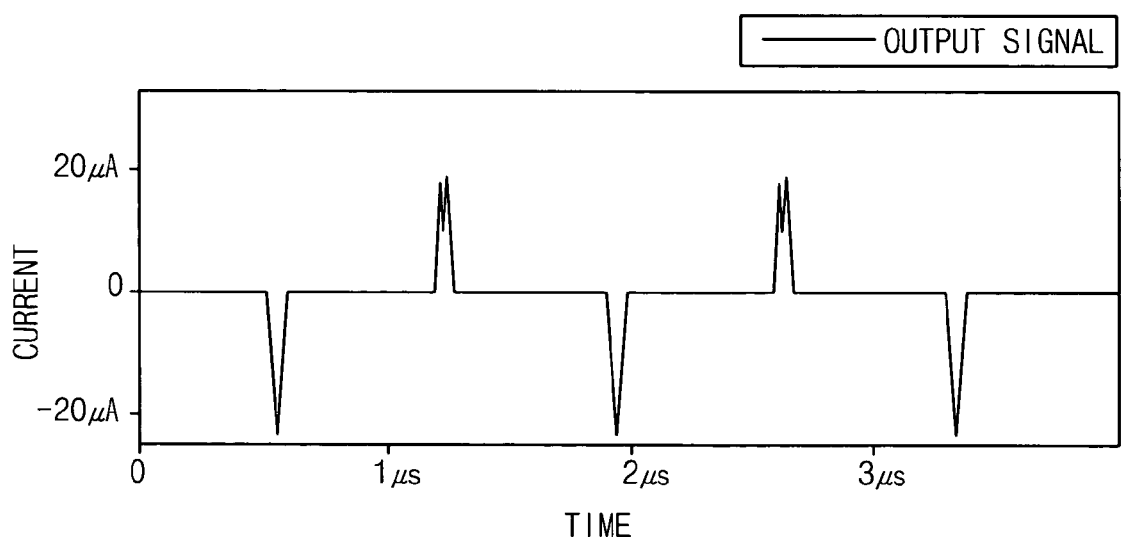
FIG. 8 is a timing diagram showing current characteristics of the level shifter shown in FIG. 5.

FIG. 7 is a timing diagram showing voltage characteristics of the level shifter 200 shown in FIG. 5. FIG. 8 is a timing diagram showing current characteristics of the level shifter shown 200 in FIG. 5.

As shown, for example, in FIG. 7, an input signal inputted to the input terminal IN2 having a level of about 3V and a period of about 1.4 μs is changed into an output signal outputted from the output terminal OUT2 having a level of about 5V and a period of about 1.4 μs.

Referring to FIG. 7, the output signal is not delayed with respect to the input signal, thus improving output signal.

Referring to FIG. 8, the level shifter 200 generates the improved output signal, and power consumption during an off state of the level shifter 200 is substantially zero. In particular, when the level of the output signal is increased from about 3V to about 5V, a leakage current during a rising period is decreased, and a peak current formed during a falling period is decreased.

In FIGS. 5 to 8, when the second transistor 220 is a PMOS transistor and the fourth transistor 240 is a PMOS transistor, they may be electrically connected so that a current flows through the second and fourth transistors 220 and 240 only during an operating period of the level shifter 200.

In addition, when the first driving voltage VDD is applied to the gate electrode of the first transistor 210 when the first transistor 210 is an NMOS transistor, the operation of the level shifter 200 may not be changed due to a variation of a threshold voltage of the NMOS transistor.

Figure 9:
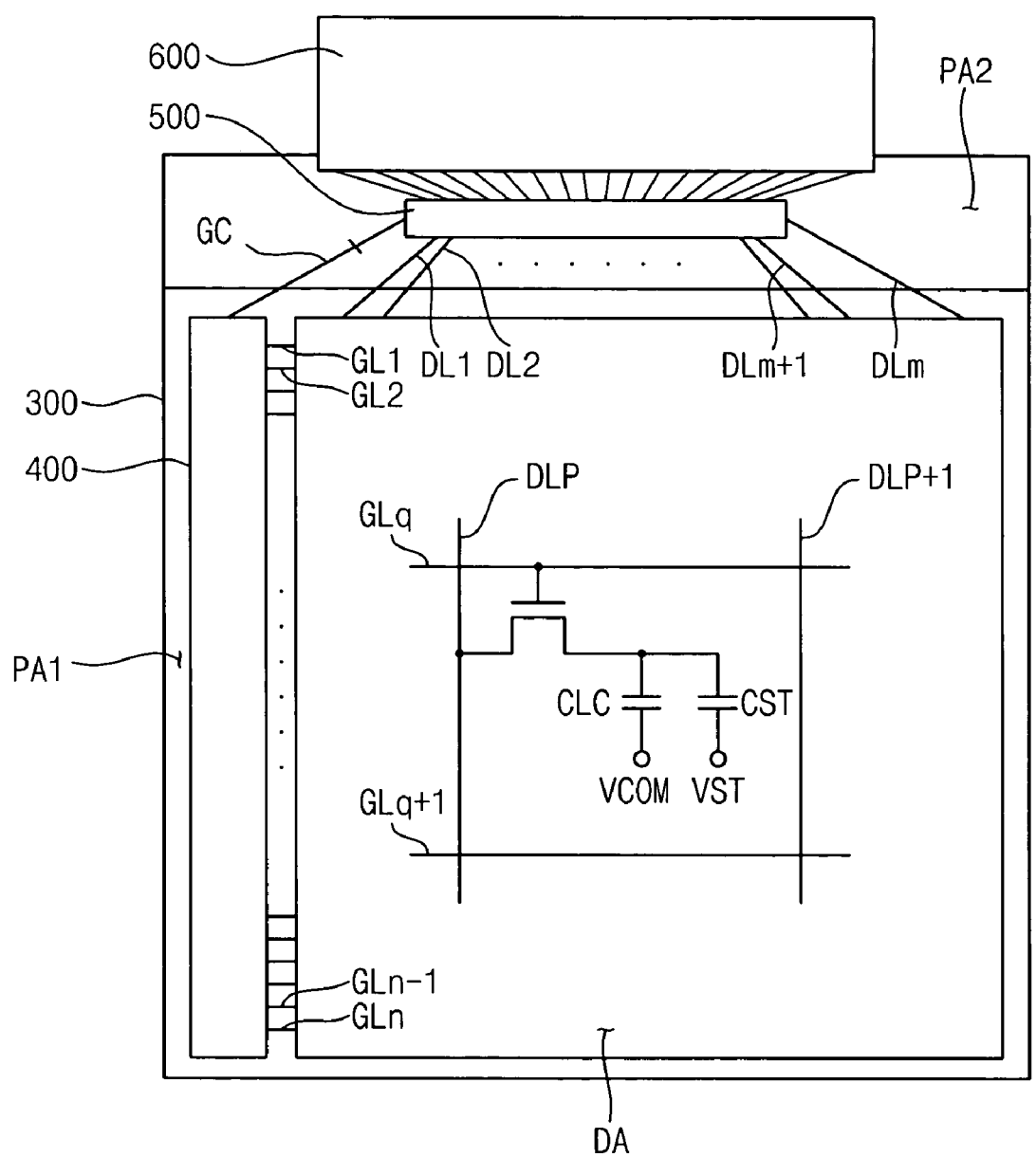
FIG. 9 is a plan view showing a display device in accordance with an exemplary embodiment of the present invention.

FIG. 9 is a plan view showing a display device in accordance with another exemplary embodiment of the present invention.

Referring to FIG. 9, the display device includes a display panel 300. The display panel 300 includes a display region DA, a first peripheral region PA1 and a second peripheral region PA2. The display panel 300 further includes an upper substrate (not shown), a lower substrate (not shown) and a liquid crystal layer (not shown). The liquid crystal layer (not shown) is interposed between the upper and lower substrates (not shown).

A plurality of gate lines GL1, GL2, ..., GLn−1, GLn, and a plurality of data lines DL1, DL2, ..., DLm+1, DLm are in the display region DA, wherein m and n are natural numbers. The data lines DL1, DL2, ..., DLm+1, DLm cross the gate lines GL1, GL2, ..., GLn−1, GLn to define a plurality of pixels.

One of the pixels is shown in the display region DA. The pixel is located between a pair of adjacent gate lines GLq and GLq+1 and a pair of data lines DLp and DLp+1, wherein p and q are natural numbers. The pixel includes a switching element Q connected to the gate line GLq and the data line DLp. The pixel further includes a pair of capacitors in parallel CLC and CST and connected between the switching element Q to receive a pair of voltages VCOM and VST, respectively.

A gate driving part 400 is in the first peripheral region PA1. The gate driving part 400 is electrically connected to the gate lines GL1, GL2, ..., GLn−1, GLn that are in the display region DA. For example, the gate driving part 400 may be simultaneously formed on the display panel 300 with the pixels.

A data driving part 500 is formed in the second peripheral region PA2. The data driving part 500 is electrically connected to the data lines DL1, DL2, ..., DLm+1, DLm that are in the display region DA. The data driving part 500 may include at least one data driving circuit. For example, the data driving part 500 is a chip mounted on the display panel 300. Alternatively, the data driving part 500 may be directly formed on the display panel 300 with the pixels.

A flexible printed circuit board 600 is in the second peripheral region PA2 of the display panel 300. The flexible printed circuit board 600 applies driving signals to the data driving part 500 and the gate driving part 400 based on externally provided signals. The driving signals include a first control signal GC that is applied to the gate driving part 400, and a second signal control signal (not shown) that is applied to the data driving part 500.

The gate driving part 400 applies gate signals to the gate lines GL1, GL2, ..., GLn−1, GLn that are in the display region DA based on the first control signal GC. The gate driving part 400 may further include a level shifter that elevates a level of the first control signal GC. For example, the level shifter of the gate driving part 400 may be the level shifter shown in FIGS. 1 or 5.

In addition, the data driving part 500 applies data signals to the data lines DL1, DL2, ..., DLm+1, DLm that are in the display region DA based on the second control signal (not shown). The data driving part 500 may further include a level shifter that elevates a level of the second control signal or a level of the data signal for displaying an image. For example, the level shifter of the data driving part 500 may be the level shifter shown in FIGS. 1 or 5.

A light generating part (not shown) may be under the display panel 300 to supply the display panel 300 with light.

Figure 10:
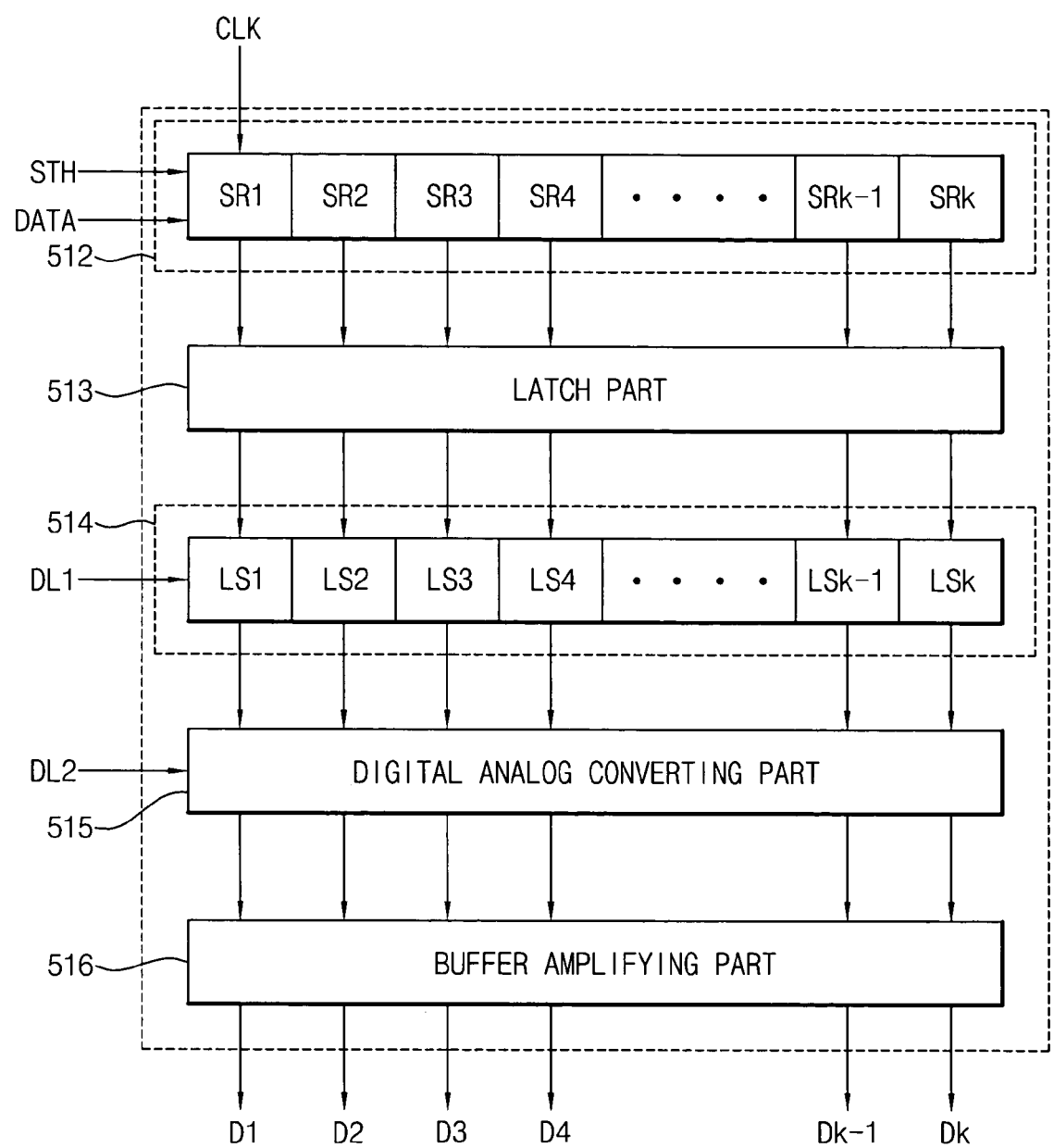
FIG. 10 is a block diagram showing a data driving circuit in accordance with an exemplary embodiment of the present invention.

FIG. 10 is a block diagram showing a data driving circuit 510 in accordance with an exemplary embodiment of the present invention. In particular, the data driving circuit 510 includes a plurality of level shifters to elevate levels of a plurality of data signals.

Referring to FIG. 10, the data driving circuit 510 includes a data shifting part 512, a data latch part 513, a level converting part 514, a digital-to-analog converting part 515 and a buffer amplifying part 516.

The data shifting part 512 includes a plurality of shift registers SR1, SR2, ..., SRk−1, SRk. When a horizontal start signal STH is applied to the data shifting part 512, the data shifting part 512 is synchronized with a clock signal CLK to store data signals, thereby shifting the data signals in sequence.

The data latch part 513 latches a plurality of shifted data that are outputted from the data shifting part 512.

The level converting part 514 elevates a level of the latched data signals that are latched by the data latch part 513 based on a first load signal LD1 so that the elevated data signals are applied to the digital-to-analog converting part 515. The level converting part 514 includes a plurality of level shifters LS1, LS2, ..., LSk−1, LSk. For example, each of the level shifters LS1, LS2, ..., LSk−1, LSk may be one of the level shifters shown in FIGS. 1 or 5.

The digital-to-analog converting part 515 converts the elevated data signals that are elevated by the level converting part 514 into a plurality of analog signals based on a second load signal LD2 so that the analog signals are applied to the buffer amplifying part 516.

The buffer amplifying part 516 amplifies the analog signals to apply a plurality of liquid crystal driving signals D1, D2, ..., Dk−1, Dk to the data lines DL1, DL2, ..., DLm+1, DLm that are in the display region DA of FIG. 9.

Figure 11:
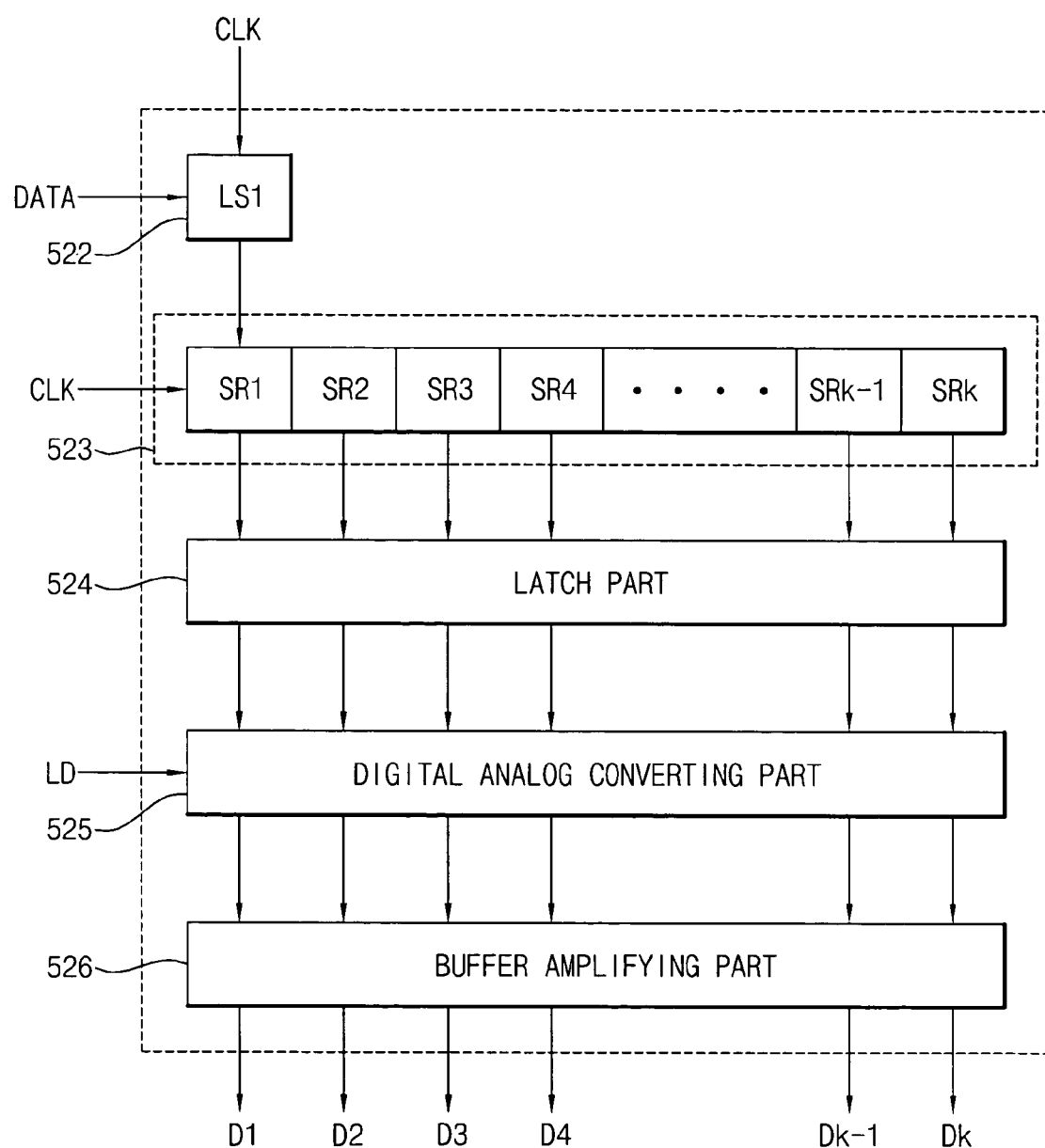
FIG. 11 is a block diagram showing a data driving circuit in accordance with another exemplary embodiment of the present invention.

FIG. 11 is a block diagram showing a data driving circuit 520 in accordance with another exemplary embodiment of the present invention. In particular, the data driving circuit 520 includes one level shifter to elevate levels of a plurality of data signals.

Referring to FIG. 11, the data driving circuit 520 includes a level converting part 522, a data shifting part 523, a data latch part 524, a digital-to-analog converting part 525 and a buffer amplifying part 526.

For example, the level converting part 522 may include at least one of the level shifters shown in FIG. 1 or 5. When a horizontal start signal STH is applied to the data driving circuit 520, the level converting part 522 elevates levels of data signals to output the elevated data signals in sequence. The horizontal start signal STH corresponds to a starting period of the level shifter.

The number of level shifters of the level converting part 522 may be half the number of shift registers of the data shifting part 523. In FIG. 11, the number of level shifters is smaller than the number of shift registers.

The data shifting part 523 includes a plurality of shift registers SR1, SR2, ..., SRk−1, SRk. A first shift register SR1 of the shift registers SR1, SR2, ..., SRk−1, SRk receives the elevated data signals that are elevated by the level converting part 522, and stores the elevated data signals in sequence.

The data signals stored in the first shift register SR1 are synchronized with a clock signal CLK to be shifted in sequence. When the stored data signals that are stored in the first shift register SR1 are sequentially shifted through remaining shift registers SR2, SR3, ..., SRk−1, SRk, the data shifting part 523 outputs the shifted data signals.

The data latch part 524 receives the shifted data signals that are outputted from the data shifting part 523 to latch the shifted data signals, thereby outputting the latched data signals.

The digital analog converting part 525 converts the latched data signals that are output from the data latch part 524 into a plurality of analog signals based on a load signal LD so that the analog signals are applied to the buffer amplifying part 526.

The buffer amplifying part 526 amplifies the analog signals to apply a plurality of liquid crystal driving signals D1, D2, ..., Dk−1, Dk to the data lines DL1, DL2, ..., DLm+1, DLm shown in FIG. 9.

Since the data driving circuit 520 of FIG. 11 has a simpler structure than the data driving circuit 510 of FIG. 10, a manufacturing process thereof is simplified, and a design margin thereof is improved. Therefore, a yield of the data driving circuit 520 is increased, and a manufacturing cost of the data driving circuit 520 is decreased.

According to an exemplary embodiment of the present invention, the level shifter only operates when the externally provided signal is applied thereto. In other words, the level shifter only consumes current during an operating period. Thus, enabling the level shifter to be stabilized during an operating period to improve an operating margin of the level shifter. Further, because the level shifter employs a single input terminal, a size of the level shifter may be decreased.

While the present invention has been particularly illustrated and described with reference to exemplary embodiments thereof, it will be understood by those of ordinary skill in the art that various changes in form and details may be made therein without departing from the spirit and scope of the present invention as defined by the following claims.

What is claimed is:

1. A level shifter, comprising:
a first transistor including a gate electrode receiving a first driving voltage, and a source electrode receiving an input signal through an input terminal;
a second transistor including a source electrode receiving the first driving voltage, and a drain electrode electrically connected to a drain electrode of the first transistor through a first node;
a third transistor including a source electrode receiving a second driving voltage, a drain electrode electrically connected to a gate electrode of the second transistor through a second node, and a gate electrode receiving the input signal;
a fourth transistor including a source electrode receiving the first driving voltage, a gate electrode electrically connected to the drain electrode of the first transistor through the first node, and a drain electrode electrically connected to the drain electrode of the third transistor through the second node;
a fifth transistor including a source electrode electrically connected to the drain electrode of the second transistor, a gate electrode electrically connected to the first node, and a drain electrode electrically connected to the gate electrode; and
an inverter that inverts a signal outputted from the second node to apply the inverted signal to an output terminal.

2. The level shifter of claim 1, wherein each of the first and third transistors is an N-channel metal oxide semiconductor (NMOS) transistor, and each of the second and fourth transistors is a P-channel metal oxide semiconductor (PMOS) transistor.

3. The level shifter of claim 1, wherein the first transistor has a greater channel width than the second transistor.

4. The level shifter of claim 1, wherein the third transistor has a greater channel width than the fourth transistor.

5. The level shifter of claim 1, wherein a ratio of a channel width to a channel length of the first transistor is about 10/6, a ratio of a channel width to a channel length of the second transistor is about 5/10, a ratio of a channel width to a channel length of the third transistor is about 50/6 and a ratio of a channel width to a channel length of the fourth transistor is about 10/6.

6. The level shifter of claim 1, wherein the inverter comprises a complementary metal oxide semiconductor (CMOS) transistor.

7. The level shifter of claim 6, wherein the CMOS transistor includes a P-channel metal oxide semiconductor (PMOS) portion and an N-channel metal oxide semiconductor (NMOS) portion, wherein a ratio of a channel width to a channel length of the PMOS portion is about 10/6 and a ratio of a channel width to a channel length of the NMOS portion is about 10/7.

8. The level shifter of claim 1, wherein a ratio of a channel width to a channel length of the fifth transistor is about 5/5.

9. The level shifter of claim 1, wherein the fifth transistor is a P-channel metal oxide semiconductor (PMOS) transistor.

10. The level shifter of claim 1, wherein the first driving voltage is about 5V to about 8.5V, and the second driving voltage is a ground potential.

11. The level shifter of claim 1, wherein the input signal is externally provided.

12. A level shifter, comprising:
a first driving voltage terminal receiving a first driving voltage;
a second driving voltage terminal receiving a second driving voltage;
an input terminal receiving an input signal;
a first transistor including a gate electrode electrically connected to the first driving voltage terminal, and a source electrode electrically connected to the input terminal;
a second transistor including a source electrode receiving the first driving voltage, and a drain electrode electrically connected to a drain electrode of the first transistor through a first node;
a third transistor including a source electrode electrically connected to the second driving voltage terminal, a drain electrode electrically connected to a gate electrode of the second transistor through a second node, and a gate electrode receiving the input signal;
a fourth transistor including a source electrode electrically connected to the first driving voltage terminal, a gate electrode electrically connected to the drain electrode of the first transistor through the first node, and a drain electrode electrically connected to the drain electrode of the third transistor through the second node;
a fifth transistor including a source electrode electrically connected to the drain electrode of the second transistor, a gate electrode electrically connected to the first node, and a drain electrode electrically connected to the gate electrode;
an inverter that inverts a signal outputted from the second node; and
an output terminal through which the inverted signal is outputted.

13. The level shifter of claim 12, wherein the input signal is externally provided.

14. A display device including a display panel having a pixel part in a pixel region defined by data and gate lines adjacent to each other, a gate driving part applying a gate voltage to the gate line, and a data driving part applying a data voltage to the data line, at least one of the gate and data driving parts including a level shifter receiving a first signal having a first level through a single input terminal, and outputting a second signal having a second level through a single output terminal, the level shifter comprising:
a first transistor including a gate electrode receiving a first driving voltage, and a source electrode receiving the first signal through the single input terminal;

a second transistor including a source electrode receiving the first driving voltage, and a drain electrode electrically connected to a drain electrode of the first transistor through a first node;

a third transistor including a source electrode receiving a second driving voltage, a drain electrode electrically connected to a gate electrode of the second transistor through a second node, and a gate electrode receiving the first signal;

a fourth transistor including a source electrode receiving the first driving voltage, a gate electrode electrically connected to the drain electrode of the first transistor through the first node, and a drain electrode electrically connected to the drain electrode of the third transistor through the second node; and an inverter that inverts a signal outputted from the second node to apply the inverted signal to the single output terminal, wherein the inverted signal is the second signal, wherein the data driving part comprises:

a plurality of shift registers that store data signals synchronized with a clock signal based on a horizontal start signal to shift the stored data signals in sequence;

a latch part that latches the shifted data signals; and a level converting part including more than one of the level shifters, the level shifters elevating a level of the latched data signals based on a first load signal.

15. The display device of claim 14, wherein the data driving part further comprises:

a digital-to-analog converting part converting the elevated data signals into a plurality of analog signals based on a second load signal; and a buffer amplifying part amplifying the analog signals to apply a plurality of liquid crystal driving signals to the data lines.

16. The display device of claim 14, wherein the first level is lower than the second level.

17. The display device of claim 14, further comprising a fifth transistor including a source electrode electrically connected to the drain electrode of the second transistor, a gate electrode electrically connected to the first node, and a drain electrode electrically connected to the gate electrode.

18. The display device of claim 14, wherein the first signal is externally provided.

19. A display device including a display panel having a pixel part in a pixel region defined by data and gate lines adjacent to each other, a gate driving part applying a gate voltage to the gate line, and a data driving part applying a data voltage to the data line, at least one of the gate and data driving parts including a level shifter receiving a first signal having a first level through a single input terminal, and outputting a second signal having a second level through a single output terminal, the level shifter comprising:

a first transistor including a gate electrode receiving a first driving voltage, and a source electrode receiving the first signal through the single input terminal;

a second transistor including a source electrode receiving the first driving voltage, and a drain electrode electrically connected to a drain electrode of the first transistor through a first node;

a third transistor including a source electrode receiving a second driving voltage, a drain electrode electrically connected to a gate electrode of the second transistor through a second node, and a gate electrode receiving the first signal;

a fourth transistor including a source electrode receiving the first driving voltage, a gate electrode electrically connected to the drain electrode of the first transistor through the first node, and a drain electrode electrically connected to the drain electrode of the third transistor through the second node; and an inverter that inverts a signal outputted from the second node to apply the inverted signal to the single output terminal, wherein the inverted signal is the second signal, wherein the data driving part comprises:

a level converting part including at least one of the level shifters, the level converting part elevating levels of data signals based on a horizontal start signal;

a plurality of shift registers that stores the elevated data signals synchronized with a clock signal based on the horizontal start signal to shift the stored data signals in sequence; and a latch part that latches the shifted data signals.

20. The display device of claim 19, wherein the data driving part further comprises:

a digital-to-analog converting part converting the latched data signals into a plurality of analog signals based on a load signal; and a buffer amplifying part amplifying the analog signals to apply a plurality of liquid crystal driving signals to the data lines.

* * * * *